United States Patent [19]
Arnold

[11] 3,979,681
[45] Sept. 7, 1976

[54] SYSTEM AND METHOD FOR DECODING RESET SIGNALS OF A TIMEPIECE FOR PROVIDING INTERNAL CONTROL

[75] Inventor: Edward H. Arnold, King of Prussia, Pa.

[73] Assignee: Solid State Scientific, Inc., Montgomeryville, Pa.

[22] Filed: Nov. 27, 1974

[21] Appl. No.: 527,831

[52] U.S. Cl. .............................. 328/48; 307/225 R; 58/23 R; 58/50 R; 58/85.5
[51] Int. Cl.² ..................... H03K 21/32; G04C 3/00; G04B 19/30
[58] Field of Search ....... 328/48; 307/225 R, 226 R; 58/23 R, 50 R, 85.5 R

[56] References Cited
UNITED STATES PATENTS

| | | | |
|---|---|---|---|
| 3,284,715 | 11/1966 | Kaminsky | 328/48 |
| 3,810,356 | 5/1974 | Fujita | 58/23 R |
| 3,815,354 | 6/1974 | Strocka et al. | 307/38 |
| 3,834,152 | 9/1974 | Nishimura et al. | 58/23 R |
| 3,855,783 | 12/1974 | Luce | 58/23 R |
| 3,871,168 | 3/1975 | Maire et al. | 58/23 R |

*Primary Examiner*—Stanley D. Miller, Jr.
*Attorney, Agent, or Firm*—Allan Ratner

[57] ABSTRACT

A solid state timepiece having a chain of series connected counters with clock pulses being applied to the first counter in the chain. A reset system is responsive to reset signals and is coupled to the counters for selective resetting of the counters upon application of predetermined reset signals. A decoder system independent of the resetting of the counters detects the state of the reset signals during a predetermined time duration and produces a control signal upon application of selected reset signal states. A control system provides internal control of the timepiece only upon application of the control signal.

16 Claims, 15 Drawing Figures

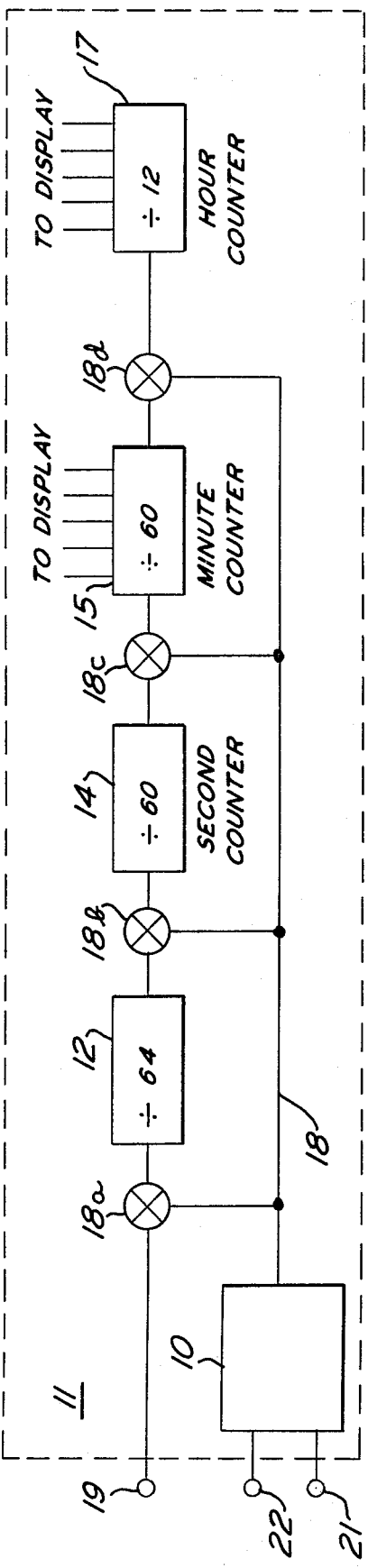
FIG.1
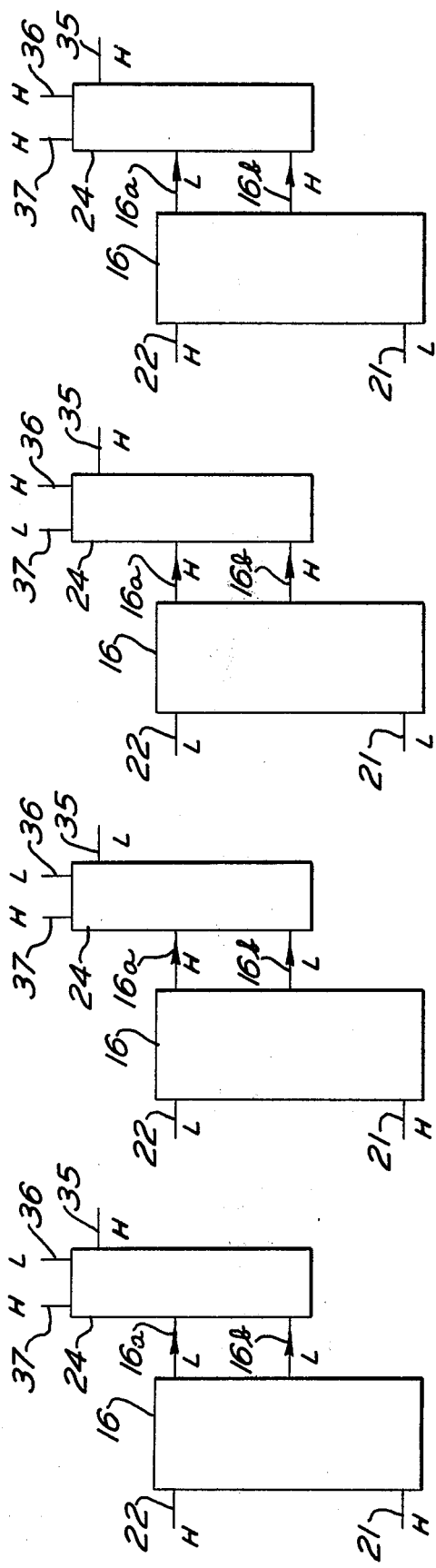
FIG.8D
FIG.8C
FIG.8B
FIG.8A

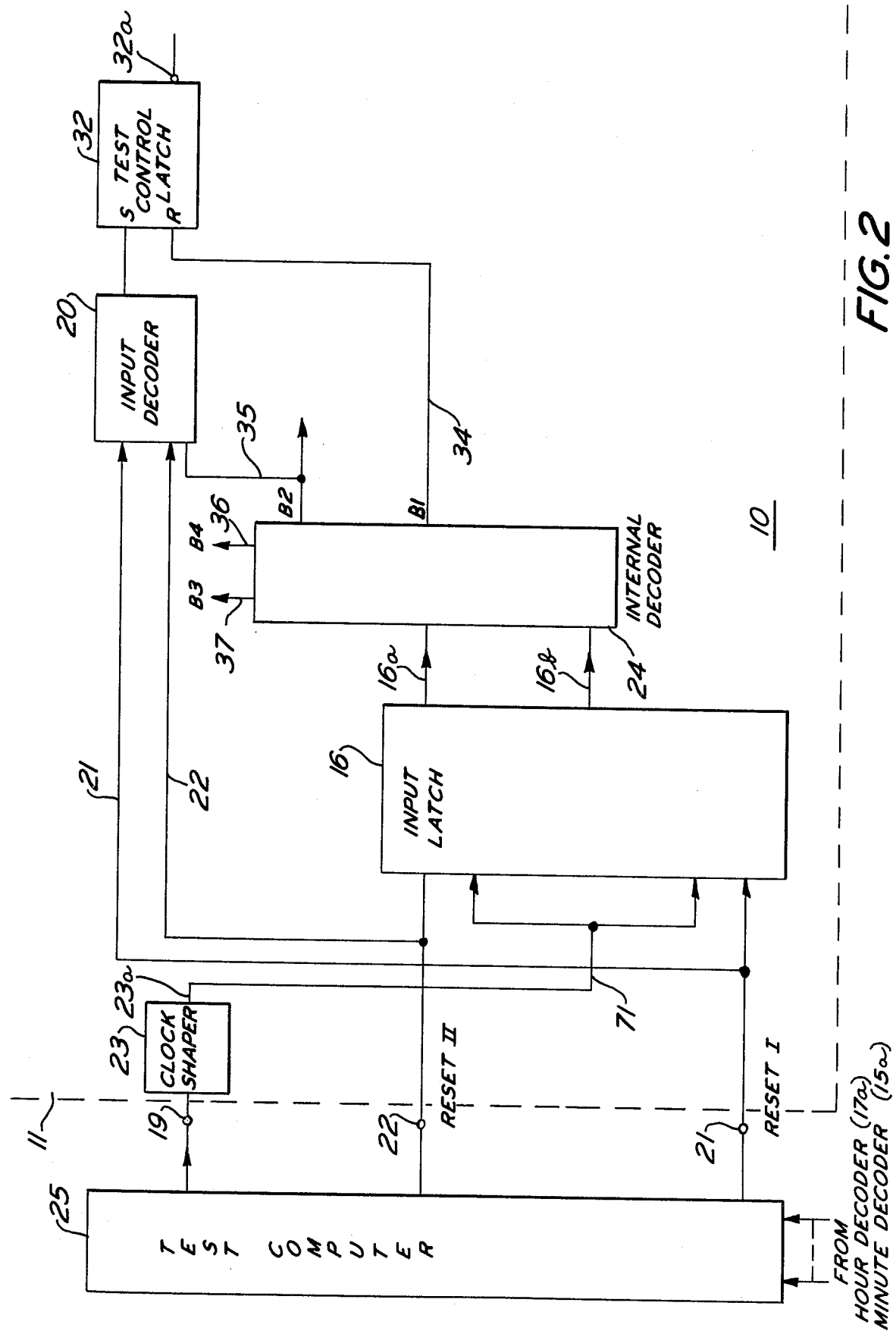

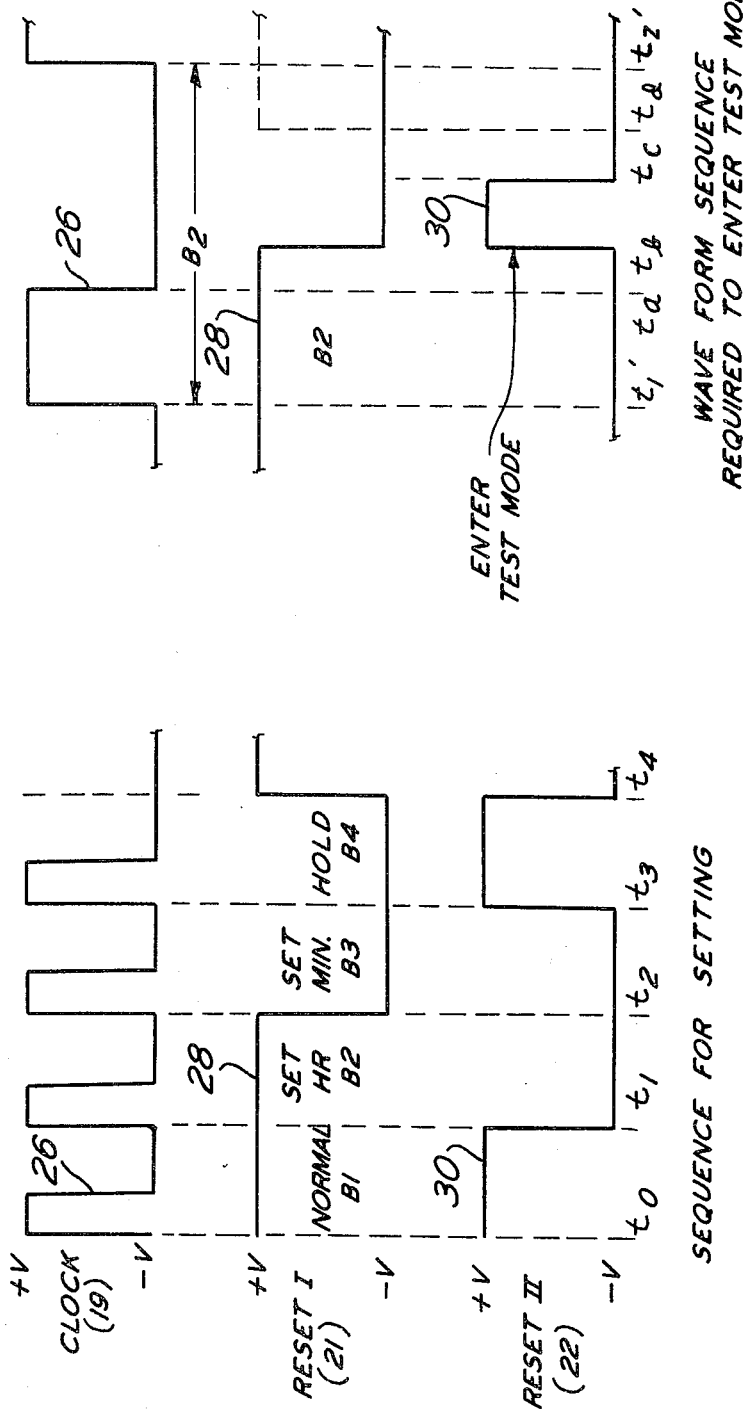

SYSTEM AND METHOD FOR DECODING RESET SIGNALS OF A TIMEPIECE FOR PROVIDING INTERNAL CONTROL

BACKGROUND OF THE INVENTION

1. Field of the Invention

This invention relates to the field of electronic solid state timepieces.

2. Prior Art

Electronic timepieces are well known which have a continuously operating clock and a chain of series connected counters. In the normal mode of operation, there is a lengthy sequence of pulses which progresses through the counters before the counters repeat themselves. For example, a solid state wristwatch may have a continuous clock operating for example, at 64 Hz which is applied to the first in a series chain of counters. The first counter in the chain may be a divide by 64 counter; the second a divide by 60 counter; the third a divide by 60 counter; and the fourth a divide by 12 counter. Accordingly, the output of the first through fourth counters provides respectively signals corresponding to parts of seconds, minutes, hours and days. In order to set these electronic timepieces, it has been known to independently return to zero at least some of the counters as generally set forth for example in U.S. Pat. No. 3,756,011.

Prior testing of timepieces and their counters after construction has left much to be desired. Testing has been particularly difficult when the counter and decoder driver circuitry of the timepiece is contained within a single complementary metal oxide semiconductor (CMOS) chip. The reason is that there is no commercially practical way to provide test points within the semiconductor chip and to reach the counters themselves. The only way that these counters may be reached is by having interconnecting wires at the edge of the chip and the package with these interconnecting wires serving no other purpose other than testing. This is unacceptable since the cost of such additional wiring would be prohibitive.

It is very desirable for proper testing techniques to reach each of the counters independently and particularly the hour and minute counters. These counters ordinarily make changes at such a low frequency rate with respect to the input clock that the actual time of test would be so long as to be commercially impractical.

It has been known to apply as a test frequency, a high frequency test clock. However, the value of the high frequency is limited by the operating limits of the input circuitry. Specifically, the first counter in the chain of counters may be a divide by 64 counter and it is that counter which is receiving the highest frequency and which limits the maximum value of the applied test frequency. Accordingly, even if a high permissible test frequency were used, it would still take a substantial amount of time to test the hour counter, for example.

SUMMARY OF THE INVENTION

A system and method for producing a control signal in a solid state timing device which is responsive to reset signals. The timing device has a chain of series connected counters with clock pulses being applied to the beginning of the chain. A reset system is coupled to predetermined ones of the counters and is effective to reset selected counters upon application of predetermined reset signals. A decoder system independent of the resetting of the counters detects the state of selected reset signals during a set time duration and produces a control signal upon application of predetermined reset signals states. A control system provides predetermined internal control of the device only upon application of the control signal.

BRIEF DESCRIPTION OF THE DRAWINGS

FIG. 1 illustrates in block diagram form counter circuitry and a reset and decoding system 10 embodying the invention;

FIG. 2 illustrates in block diagram form system 10 of FIG. 1;

FIGS. 4-4A illustrate waveforms of reset signals and clock pulse signals applied to system 10;

DESCRIPTION OF THE PREFERRED EMBODIMENT(S)

Figure 3A:
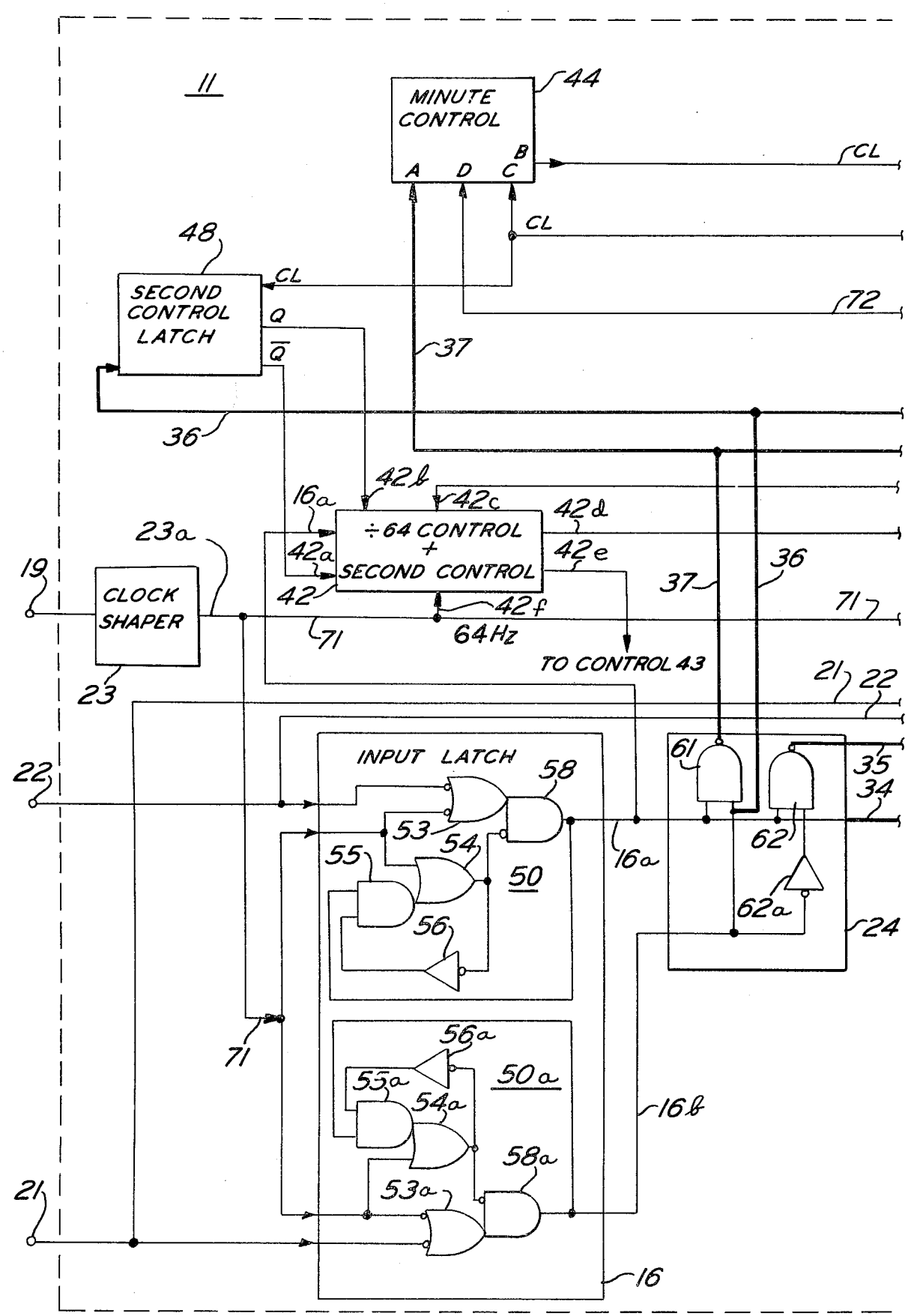
FIGS. 3A-B taken together illustrate in more detail the counter circuitry and system 10 of FIGS. 1 and 2 and the decoder driver circuitry all making up the array of chip 11.

Referring now to FIGS. 1-3A-B, there is shown in phantom a single semiconductor chip 11 containing a complex electronic array forming counter and decoder driver circuitry of a solid state timepiece or wristwatch, not shown. The decorder drivers actuates conventional electro-optical digital LED displays (not shown). The other components of the solid state wristwatch may be a crystal controlled oscillator and frequency divider circuits (not shown) for lowering the frequency of the oscillator to form clock pulses to a pulse repetition frequency (prf) of 64 Hz. The frequency divider circuits may be contained on a separate semiconductor chip. The power requirements of the circuits are extremely low so that a small battery may be used. All of these components of the solid state wristwatch may be made small in size for compact assembly within a watch case.

GENERAL DESCRIPTION OF ARRAY

As shown in simplified form in FIG. 1, a chain of series connected counters 12, 14, 15 and 17 define a counter circuit for the electronic timepiece. 64 Hz clock pulses 26 are applied to a clock input 19 which is an input terminal or pin of chip 11. The clock pulses are then applied through a gating circuit 18a to a divide by 64 counter 12. The output of counter 12 is at a prf of 1 pulse per second (pps) which is applied through gating circuit 18b to a divide by 60 counter 14 which functions as a second counter.

Counter 14 produces a prf of 1 ppm which is applied through a gating circuit 18c to a divide by 60 counter 15 which operates as a minute counter. The output of counter 60 is applied by way of gating circuit 18d to a divide by 12 counter 17 which functions as the hour counter. In the normal operate mode (B1) counters 12, 14, 15 and 17 are connected in the series chain as illustrated for the time keeping function. Control signals produced by system 10 are applied to gates 18a–18d by way of selected paths shown generally as line 18 for purposes of explanation. In this way, clock pulses at clock input 19 may be applied directly to hour counter 17 or to minute counter 15.

GENERAL DESCRIPTION OF SYSTEM 10

System 10, as shown in block diagram form in FIG. 2, provides for the resetting of the counters for time setting purposes as well as providing for entering the test mode. Specifically, chip 11 has two conventional reset inputs, viz, RESET I (21) and RESET II (22) which are formed as input terminals or pins of chip 11. These reset inputs 21, 22 are normally used to allow the timepiece to be manually set to the correct time. Reset signals are generated by manually operable conventional switches (not shown) accessible external of the timepiece and are applied to reset inputs 21, 22.

The reset signals applied to reset inputs 21, 22 are transmitted by way of interconnecting wiring to an input latch 16. The outputs of latch 16 are applied to an internal decoder 24 which decodes the reset signals to produce internal mode control signals B1–B4. In manually setting the watch, the following sequence is used.

Table A

| 21 | 22 | MODE | |
|---|---|---|---|
| H | H | OPERATE | B1 |
| H | L | HR | B2 |
| L | L | MIN. | B3 |
| L | H | HOLD | B4 |

A high will be considered here as the most positive potential while a low is considered as the most negative potential.

It will be understood that the B1–B4 internal mode signals are produced at the outputs of the internal decoder 24 and the state of these signals can only be produced and modified at the time that a clock pulse 26 is in its high state. Any variation in the set of the reset signals from the time of termination of the clock until the next clock high does not result in a change in the B1–B4 internal signals.

The reset signals are also applied to two of three input terminals of an input decoder 20, the output of which is connected to the set terminal of a test control latch 32. The remaining input of decoder 20 is provided by the B2 output of decoder 22.

The 64 Hz clock pulses applied to clock input 19 are shaped by shaper 23 so that the resultant clock pulses 26 have at output 23a a desirable steep rise and fall waveshape as shown in FIG. 4. Clock pulses 26 are then applied by way of line 71 to additional inputs of latch 16.

A. WAVEFORMS-NONTEST FIG. 4

In FIG. 4 between lines $t_0$–$t_1$, there is shown the operate mode (B1) for normal operation of the timepiece. Thus, as set forth in Table A, both reset pulses 28 and 30 applied to terminals 21, 22 are high and the B1 operate mode is produced.

During times $t_1$–$t_2$, hour counter 17 may be set since the input to terminal 21 is high and the input to terminal 22 is low. Accordingly, decoder 24 produces mode signal B2. In this manner, the hour counter 17 may be incremented at a 1 Hz rate.

During the time period $t_2$–$t_3$, both terminals 21, 22 are low and therefore mode signal B3 is produced which results in minute counter 15 being advanced at a 1 Hz rate. Finally, during the time period $t_3$–$t_4$, with terminal 21 being low and terminal 22 being high, the hold mode is entered producing a B4 mode with none of the counters being advanced and the timepiece effectively stopped.

It will be understood that the foregoing description defines a sequence for manually setting the timepiece in modes B1–B4.

B. WAVEFORMS-TEST FIG. 4A

By generating differing ones of modes B1–B4 by means of a conventional test computer 25, for example, the test mode may be entered so that the array becomes a device under test with the signals from the hour and minute decoder being applied to computer 25. Such entering of the test mode may only be accomplished by the waveform sequence set forth in FIG. 4A within a predetermined time duration. This waveform sequence within the time duration is not practically achievable by normal manual operation of the watch by the user. It is in this manner that there is achieved the generation of special control signals which are able with great versatility to test chip 11. It will be understood that a control signal may be used for differing purposes as will later be described.

As shown in FIG. 4A, the time period between time $t_1'$–$t_2'$ defines one cycle of the clock. Corresponding with time period $t_1$–$t_2$ (FIG. 4), at time $t_1'$ terminal 21 is high and terminal 22 is low. Thus, mod B2 is entered which continues after clock pulse 26 goes low at time $t_a$. The B2 mode continues, since, as previously described, a mode signal cannot charge until the occurrence of the next high clock pulse 26.

As shown in FIG. 4A, at time $t_b$ terminal 21 goes low and terminal 22 goes high and it is at this time that the test mode is entered by the setting of test control latch 32. This change in the states at terminals 21, 22 is representative of mode B4, as shown in Table A, but a change in mode does not occur since the clock pulse high terminated at time $t_a$ which is prior to time $t_b$. At time $t_c$, terminal 21 is maintained low while terminal 22 goes low (corresponding to a B2 mode). On the other hand, at time $t_c$ or, as illustrated, at time $t_d$, terminal 21 may go high (corresponding to a B3 mode).

Thus, by the correct manipulation of the signals applied to reset terminals 21, 22, there is achieved the entering of the test mode at time $t_b$ and a maintenance of the test mode. This correct manipulation first requires that during clock pulse high 26, a B2 mode is produced. At the termination of or after the termination of clock pulse high 26, there must then be produced reset signals corresponding to a B4 mode which causes the test mode to be entered. Prior to the expiration of the negative excursion of the clock pulse at time $t_2'$, reset signals corresponding to a B2 or a B3 mode must be applied to terminals 21, 22. If reset signals corresponding to B2 or B3 mode are not applied prior to time $t_2'$, then the test mode would be automatically excited.

As previously described, the B2 mode continues until time $t_2'$ which is the occurrence of the next high clock pulse 26. At that time, internal decoder 24 determines whether the B2 mode shall continue for the test mode or if the B3 mode shall be entered in accordance with the state then presented at terminals 21, 22. It will be understood that the reset signals corresponding to a B3 mode may be applied at any time between $t_r$–$t_2'$. However, the change from the B2 to the B3 mode still would not occur until $t_2'$ since the B signals are internally decoded which only occurs at the time of high clock pulse.

The time duration $t_b$–$t_c$ (in which reset signals are applied corresponding to a B4 mode) is not critical and may be at any time during the low excursion of the clock and allow time to enter the B2 or B3 mode.

It will be understood that the manner in which the test mode is entered as previously described is of importance so as to prevent it from occurring during normal operation of the timepiece by the user. It would be virtually impossible for the user of the watch to enter the test mode since he would have to manually manipulate the switches during one cycle of the clock. Specifically, the user would have to manipulate a B2 mode initially and then manipulate a B4 and then a B2 or B3 mode during the time of that low clock cycle. This would be virtually impossible since the normal clock cycle is one-fifteen thousandths of a second with input clock 19 operating at a rate of 64 Hs.

The foregoing operation is achieved by system 10 in the following manner. It will be understood that latch 16 only inspects the state of reset terminals 21, 22 when clock 26 is high. Thus, changes that occur at terminals 21, 22 when the clock is low are not accepted by latch 16. That is to say that latch 16 is not responsive to and is not armed during the time the clock pulse is low. As a result there is provided further gating circuitry which is responsive to such information at terminals 21, 22 when the clock is low. Specifically, input decoder 20 is responsive to such low signals and controls the set terminal of latch 32 which provides at its output 32a a control signal indicating that the test mode has been entered.

DETAILED DESCRIPTION OF ARRAY AND SYSTEM 10

Figure 5:
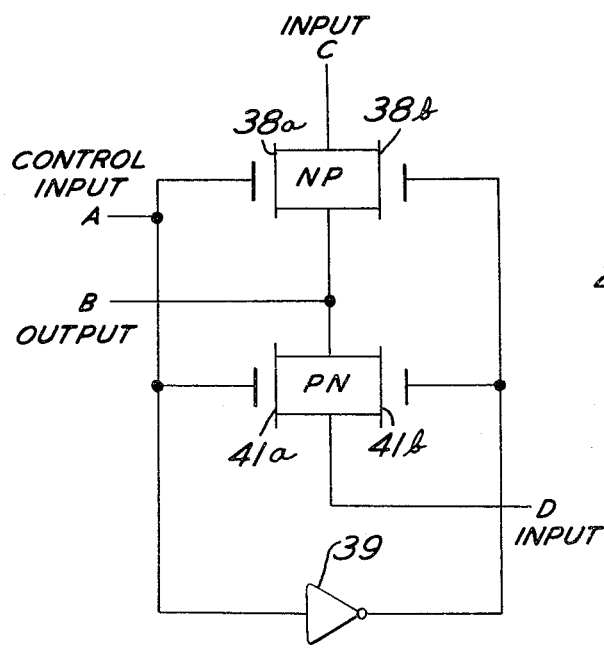
FIGS. 5 and 6 illustrate in more detail controls shown in block diagram form in FIGS. 3A-B.

FIG. 5 illustrates in detail a control circuit shown in block diagram form of FIG. A–B as controls 43–47. The circuit of FIG. 5 is effective to route a signal from input terminal C to output B or from input D to output B depending upon the state of control input A. The control circuit comprises two FET bilateral switches 40a, b and 41a, b, connected as shown. If a high signal were applied to control input A which is connected to the gate of the n-channel FET, then that n-channel is turned on and the signals appearing at input C would be routed to output B. At the same time with the n-channel turned on, there is applied by way of inverter 39 a signal to the gate of the p-channel to turn on that p-channel so therefore the signal applied to terminal C is also routed by way of the p-channel to output B. It is in this way that there is provided a full signal excursion of both positive and negative going potentials from input C to output B. Similarly, if control input A were a low the p-channel would be turned on and by way of the inverter, the n-channel would be turned on. Accordingly, the signals appearing at input D would be routed by way of the pair of parallel connected FET transistors to output B.

Figure 3B:
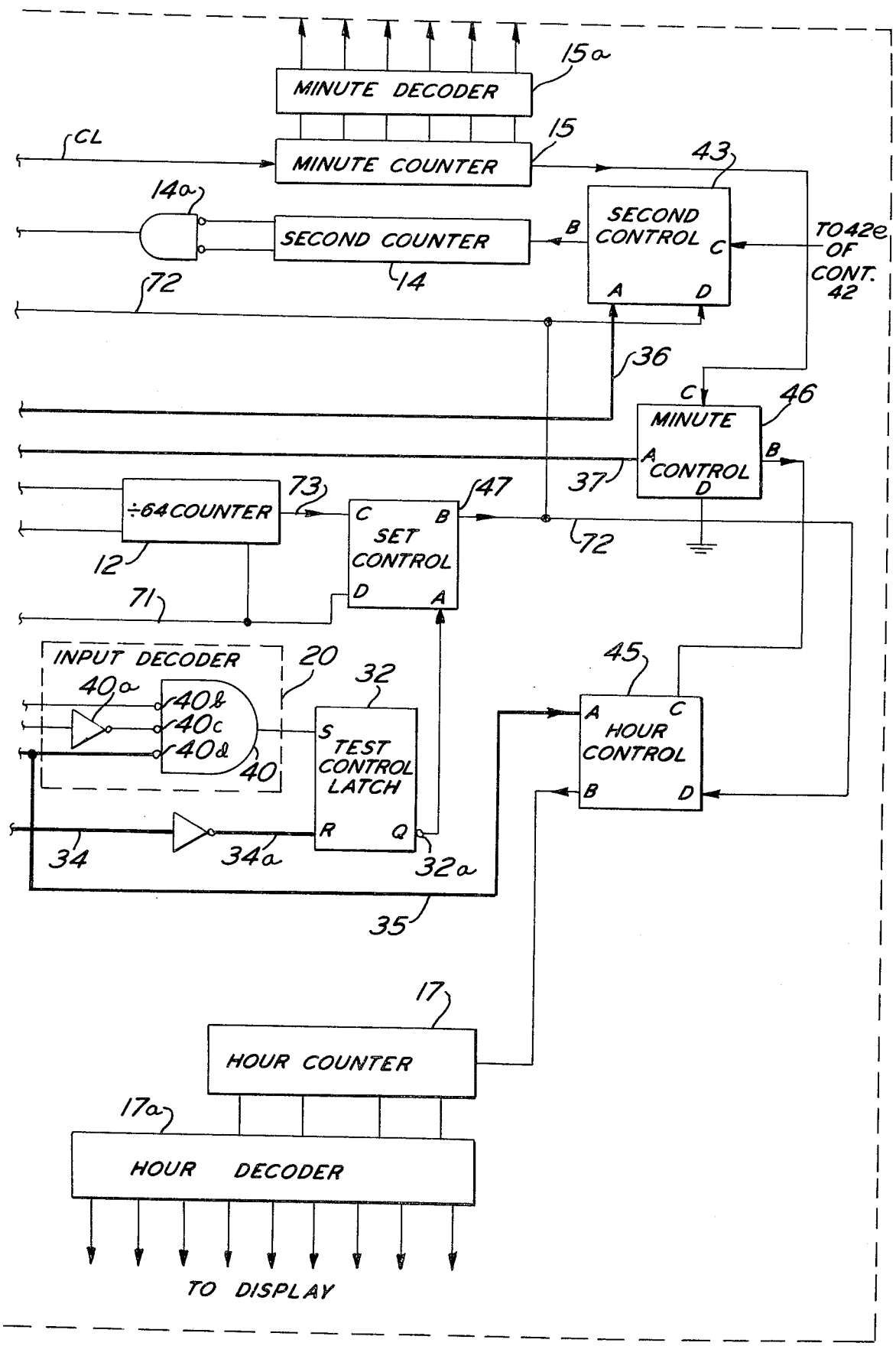

Referring now to FIG. 3A–B, there is shown in detail the complex array of chip 11 including system 10. As previously described, the clock input is applied to terminal 19 and the reset signals are applied to terminals 20, 21. In order to explain the operation of the system, the normal nontest modes B1-4 as shown in FIG. 4 will first be explained and then the operation of entering the test mode will be described.

A. MODE B1 — NONTEST

In the B1 or normal mode with the signals applied as in Table A, clock pulse 26 is shaped by shaper 23 and applied by way of line 71 to "arm" strobe latch sections 50, 50a of input latch 16. Accordingly, the state of reset terminals 21, 22 may be loaded into latches 50, 50a. Latch sections 50, 50a are effective to invert the potentials of reset terminals 21, 22 to produce at lines 16b, 16a respectively a low and a low as shown in FIG. 8A. Lines 16a, b are applied to internal decoder 24 which comprises NAND gates 61, 62 and inverter 62a connected as shown.

With line 16a being low, gates 61, 62 produce highs on respective output lines 37, 35 (time reset control signals B3, B2). On the other hand, since line 16b is directly connected to line 36 (B4), that line is low as shown in FIG. 8A.

Output line 36 is coupled to control input A of seconds control 43. With line 36 low, then input D of control 43 is connected to output B so that the 1 Hz clock pulses then on line 72 are applied to seconds counter 14 for normal operation. In addition, line 36 is also coupled to reset latch 48, the operation of which will later be described.

Output line 37 is coupled to control input A of minute control 46 and with that line 37 being high, input C of control 46 is coupled to output B. This provides for normal operation with the output of minute counter 15 being applied through control 46 to the C input of hour control 45. Further, line 37 is also coupled to control input A of minute control 44. With line 37 being high, input C is coupled to output B for normal operation of the minute counter to receive the output of seconds counter 14.

Line 35 is connected to control input A of hour control 45. Thus, input C of hour control 45 is coupled to B which in turn is connected to hour counter 17. This provides for normal operation of hour counter 17 since the output of minute counter 14 is applied to input C.

With a low applied by way of line 36 to terminal 48a of latch 48, the latch is in its state of forced direct reset. Latch 48 is a resettable toggle flip-flop. Thus, outputs Q and $\overline{Q}$ respectively provide a forced low and a forced high to inputs 42b, a of divide by 64 control and second control 42. In addition, 64 Hz clock pulses are applied by way of line 71 from shaper 23 to input 42f of control 42. These clock pulses flow by way of enabled gates 64, 65 to respective lines 42d and 42e.

Line 42d applies the 64 Hz pulses to counter 12 which divides by 64 and the resultant 1 Hz clock pulses are applied by way of line 73 to input C of control 47. In the nontest mode, Q output 32a of latch 32 is high and therefore the 1 Hz pulses at input C are coupled to line 72 for the operate mode B1.

Thus, in the foregoing manner, the timepiece normally operates in the operate mode with 1 Hz clock pulses applied through control 43 to the seconds counter 14 which in turn operates the minutes counter 14 which in turn operates the hour counter 17.

B. MODE B2 — NONTEST

In the B2 mode with the clock pulse 26 applied to terminal 19, latches 50, 50a are armed and the respective low and high reset signals are loaded. Accordingly, lines 16a,b are high and low respectively which produces a low, low, high at lines 35–37 respectively as shown in FIG. 8B. It will be understood that the only change with respect to FIG. 8A is that line 35 has changed from a high to a low. Accordingly, control 45 is switched so that input D is connected to output B and the 1 Hz pulses on line 72 are now coupled to hour counter 17 so that hours may be advanced. However, all of the other counters continue to count from counter to counter in their normal manner since in the B2 mode, it is only necessary to advance hours and there is no reason to change the previous clocking.

C. MODE B3 — NONTEST

In the B3 mode as shown in FIG. 8C, line 35 has returned to its normal high so that in control 45 input C is connected to output B.

In addition, line 37 has switched from a high to a low (as compared with the B1 and B2 modes) so that in control 44, output B is switched from C to D. Thus, the input to minute counter 15 is now 1 Hz pulses rather than the output of second counter 14. In control 46, input C is coupled to terminal D which is grounded. It is in this manner that the minute counter 15 is effectively isolated from its normal path so that this counter can be incremented by the 1 Hz pulse on line 72 without affecting the other counters.

Further in the B3 mode, line 26 has switched from a low to a high as compared with the B1 and B2 modes. With a high applied to input 48a, the reset is effectively removed and latch 48 transfers state upon application of a CL pulse to input 48b. A CL pulse is produced at the next transition to a count of zero by counter 14. Accordingly, latch 48 is set which applies a high and a low from the respective Q, $\overline{Q}$ terminals to control 42. The Q high is effective to disable gate 65 and prevent the 64 Hz pulses from being applied to counter 14.

It will now be understood that any spill over from seconds counter 14 does not go into minute counter 15. Seconds counter 14 is stopped at a zero count and is effectively turned off.

D. MODE B4 — NONTEST

In the B4 mode, as shown in FIG. 8D, all of the lines 35–37 are high and the hold mode is initiated. As previously described for control 45 with line 35 high, C is connectd to B as in the operate mode. Also as in the operate mode with line 37 high, inputs C are connected to outputs B in controls 44 and 46.

In order to provide the hold mode, the high signal on line 36, as previously described, is effective to set latch 48 at the next transition of a count of zero from counter 14. Accordingly, a high and a low are applied from the respective terminals Q and $\overline{Q}$ to inputs 42b, 42a of control 42. In this manner gate 65 is disabled preventing the 64 Hz pulses from being applied to line 42e. Since line 16a has changed to a low, gate 64 is also disabled stopping the clock pulses from being applied to counter 12. Gate 64 is controlled by OR-NOR gate 68 cross coupled with a NOR gate 66 which has as inputs lines 16a and 42a. It is in this manner that the hold mode is entered at the zero count.

E. ENTERING THE TEST MODE

Figure 7A:
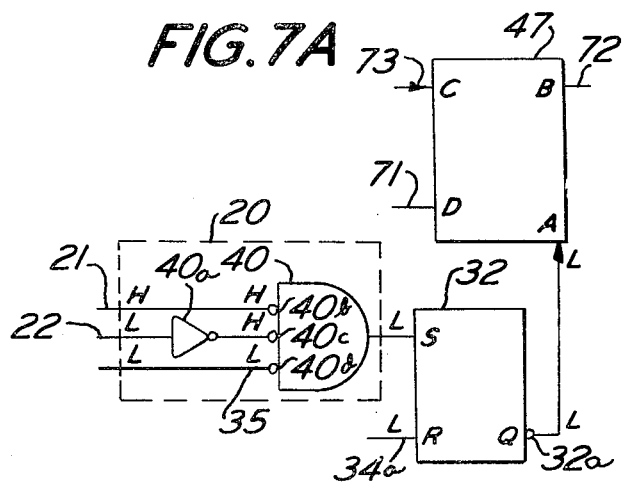
FIGS. 7A-C show the state of signals at input decoder 20 and latch 32 of FIGS. 3A-B during selected times; and, FIGS. 8A-D show the state of signals at input latch 16 and internal decoder 24 of FIGS. 3A-B during selected times.

There has now been described the nontest mode of the timepiece as set forth in FIG. 4. The test mode is entered in the manner previously described according to the waveforms of FIG. 4A. As shown in FIG. 7A, reset signals corresponding to a B2 mode during times $t_1'$—$t_a$ produce highs at inputs 40b–c of decoder gate 40. In the B2 mode, both lines 35 and 34a are low. Accordingly, the 40b, 40c and 40d inputs to gate 40 are high, high, low respectively and the resultant low output is applied to the set input of test control set-reset flip-flop or latch 32. With a low applied to the set input and a low (line 34a) applied to the reset input, the Q output 32a is at a low. The resultant low is applied to the A control input of control 47 and provides for the 1 Hz clock pulses to be applied to the output 72 in accordance with the previously described nontest operation.

Figure 7B:
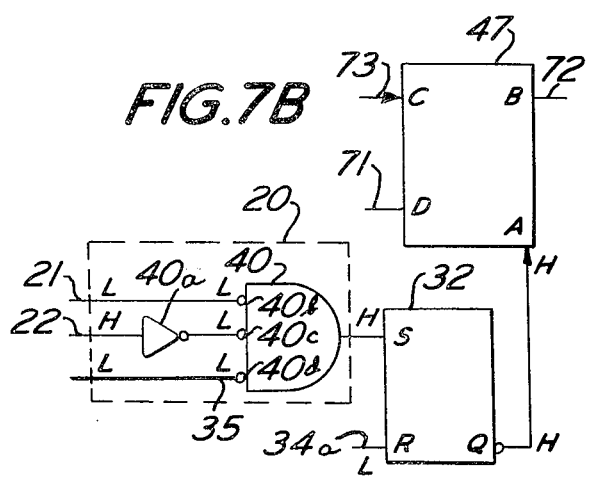
Figure 6:
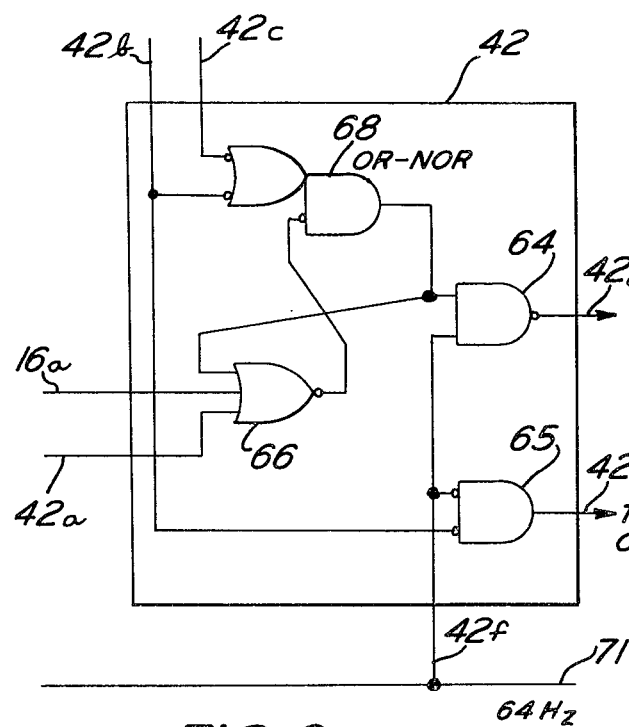

In the next step of entering the test mode, as for example at time $t_b$ of FIG. 4A, and as shown in FIG. 7B, reset signals corresponding to a B4 mode (and only a B4 mode) produce at inputs 40b–c a low and a low respectively. Since latch 16 has been "latched" at the end of pulse 26, lines 35 and 34a remain latched at a low. Accordingly, gate 40 produces a high output which causes latch 32 to change state as this latch only changes state (and latches there) upon application of a high to either input. Thus, a high is produced at Q output terminal 32a. This high control signal is effective to enter the test mode by switching control 47 to connect the 64 Hz clock to line 72 to provide for high frequency advancing of the counters.

Figure 7C:
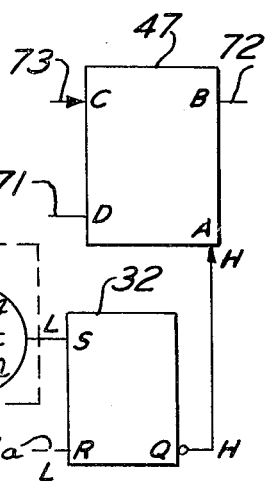

It will be recalled that prior to the time of the next clock pulse 26, viz, time $t_2'$, signals corresponding to a B2 or a B3 mode are required to be applied as shown in FIG. 7C in order that the test mode be maintained. Only in either of these two modes does line 34a remain lower after appearance of the clock pulse at time $t_2'$ when latch 16 may again be armed. Accordingly, latch 32 is prevented from changing state by the low applied to the reset terminal. In this manner the high is maintained at output 32a for continuance of the test mode. It will be understood that if signals corresponding to the B2 or B3 mode were not applied, then the resultant high at the reset terminal would cause latch 32 to change state and the timepiece would exit from the test mode and revert to the nontest mode.

Accordingly, it will now be understood that the test mode may continue under the control of test computer 25 in either the B2 or the B3 mode. In a manner similar to that previously described for the nontest B2 mode, control 45 is effective to apply the 64 Hz clock to counter 17 for test. In the B3 mode test controls 44, 46 are effective to apply the clock to counter 15 for test.

It will be understood that the purpose of input latch 16 is to strobe reset terminals 21, 22 so that the signals on these terminals are not "listened to" unless clock pulse 26 is high. This is to say that clock pulse 26 is effective to arm latches 50, 50a so that, for example, from $t_a$ through time $t_2'$ (FIG. 4A) the signals at terminals 16a,b do not change and therefore the signals from internal decoder 24 do not change. Thus, the variation in the signals produced at terminals 21, 22 are only being "listened" to by input decoder 20.

The detailed operation of identical strobe latch sections 50, 50a will be understood by those skilled in the art. Specifically, for section 50, reset terminal 22 is connected to one input of OR-NOR combinatorial gate 53, 58. The clock pulse is applied by way of line 71 to another input of that combinatorial gate. The feedback portion for OR-NOR gate 53, 58 is comprised of AND-NOR gate 54, 55 and inverter 56 as shown.

In the method of operation as shown in FIG. 4A, it will be understood that the reset signals applied to terminals 21, 22 have to be applied at the time of a clock pulse 26 in order to first produce the B2 mode. Accordingly, line 35 is latched to a low which is indicative of an inferred clock pulse. It is in this way that gate 40 is "enabled" and at the termination of the clock pulse (FIG. 7B) the reset signals are such that the other two inputs to gate 40 are also low. The resultant high is applied to the set terminal of latch 32 causing latch 32 to change state and produce a control signal to set control 47. It is to be noted that only in the B2 mode is line 35 low and therefore, the B2 mode must be present at the time of pulse 26 for the test mode to be entered.

It will be understood that in the method of operation there is a manipulation of the reset signals on reset lines 21, 22 with respect to clock pulse 26 which may be accomplished, for example, by test computer 25 as shown in FIG. 2. As described, to enter the test mode there are required predetermined reset signals having selected states during the time of clock pulse 26 and a selected sequence of states prior to the next succeeding clock pulse. While these reset signals have been shown as being entered in parallel, such information could also be entered serially. Thus, in another embodiment not shown, a serial code may be entered on one of the reset lines and decoded to operate one or more control latches.

It will also be understood that latch 32 and its control signal may be used for purposes other than those previously described. For example, latch 32 may be used to reset all of the counters or disable any one or more of the control circuits. Further, latch 32 may be used to turn off or disable minute decode 15a and hour decoder 17a.

What is claimed is:

1. A solid state timing device responsive to reset signals and having a chain of series connected counters with clock pulses being applied to the beginning of the chain comprising
   reset means coupled to predetermined ones of said counters for resetting selected ones of said counters upon application of predetermined reset signals; and
   decoder means connected to said reset means but independent of said resetting of said counters for detecting the state of reset signals during a predetermined time duration for producing a control signal,
   control means connected to said decoder means for providing predetermined internal control of said solid state timing device only upon application of said control signal.

2. The solid state timing device of claim 1 in which there is provided a plurality of switching means coupled to individual ones of said counters, means including said logic control means coupling said decoder means and said reset means to said switching means for flow of clock pulses to selected ones of said counters and for selective interconnection of said counters when said control signal is produced.

3. The solid state timing device of claim 2 in which said decoder means includes means for detecting reset signals having a sequence of signal states at a predetermined time relation to a clock pulse for producing said control signal for entering a test mode of said timing device.

4. The solid state timing device of claim 2 in which there is provided test means for applying to said reset means clock pulses and predetermined reset signals, said predetermined reset signals having selected states during the time of a clock pulse and a selected sequence of states prior to the next succeeding clock pulse, said decoder means including means for detecting said selected states and said selected sequence of states for producing said control signal for entering a test mode of said timing device.

5. The solid state timing device of claim 4 in which said decoder means includes gate means and latch means, said reset means including means for enabling said gate means when said reset signals have said selected states during the time of a clock pulse whereby said latch means is set prior to the next succeeding clock pulse upon application to said enabled gate means of said selected sequence of reset signal states.

6. The solid state timing device of claim 2 in which said clock pulses are applied to a first counter in said chain, a first of said switching means coupled to an output of said first counter and controlled by said control signal for applying said clock pulses directly to a second of said counters thereby bypassing said first counter.

7. A method of producing a control signal in a timing system responsive to reset signals and having a chain of series connected counters with clock pulses being applied to the beginning of the chain which comprises the steps of
   a. resetting selected ones of said counters upon application of predetermined reset signals,
   b. detecting and decoding the state of selected reset signals during a predetermined time duration for producing a control signal independent of resetting selected ones of the counters, and
   c. providing predetermined internal control of the timing system only upon production of the control signal.

8. The method of claim 7 in which there is provided the further steps of applying clock pulses to selected ones of said counters when said control signal is produced, and interconnecting selected ones of said counters when said control signal is produced.

9. The method of claim 8 in which there is provided the further steps of detecting reset signals having a sequence of signal states at a predetermined time relation with a clock pulse for producing said control signal, and entering a test mode of said timing system when said control signal is produced.

10. The method of claim 8 in which there is provided the further steps of generating reset signals having selected sequence of states prior to the next succeeding clock pulse, detecting the selected states during the time of the clock pulse and the selected sequence of states between clock pulses for producing said control signal, and entering a test mode of the timing system when the control signal is produced.

11. The method of claim 8 in which there is provided the further steps of
   enabling bistable means by providing reset signals having selected states during the time of a clock pulse,
   setting the bistable means by reset signals having a selected sequence of states prior to the time of the next succeeding clock pulse,
   producing the control signal upon setting of the bistable means, and entering a test mode of the timing system when the control signal is produced.

12. The method of claim 8 in which there is provided the further steps of applying the clock pulses to a first counter in the chain, applying said clock pulses directly to a second of said counters and bypassing said first counter when the control signal is produced whereby said second counter counts at the rate of said clock pulses.

13. In a solid state timepiece having a chain of series connected counters with clock pulses applied to the beginning of the chain, an internal high speed testing system which enters a test mode for testing by an applied test signal only upon application of selected reset signals comprising a plurality of switching means coupled to individual ones of said counters, reset means connected to said switching means having said clock pulses and said reset signals applied thereto for producing time reset control signals in response to the state of said reset and clock pulses for application to said switching means for selective resetting of said counters, and decoder means independent of said selective resetting of said counters coupled to said reset means for producing a test control signal only upon application of predetermined reset signal states at the time of a clock pulse and a predetermined sequence of reset signal states are applied prior to the next clock pulse, control means coupled to said decoder means and said switching means for entering a test mode of said timing device and applying said test signal to a selected counter only upon application of said test control signal.

14. The solid state timepiece of claim 13 in which said decoder means includes gate means and bistable means, said reset means including means for enabling said gate means upon application of said predetermined reset signal states during the time of a clock pulse whereby said enabled gate means produced a signal to set said bistable means prior to the next succeeding clock pulse upon application to said enabled gate means of said predetermined sequence of reset signal states.

15. The solid state timpeiece of claim 14 in which said clock pulses are applied to a first counter in said chain, a first of said switching means coupled to an output of said first counter and controlled by said control signal for applying said clock pulses directly to a second of said counters thereby bypassing said first counter whereby said second counter counts at the rate of said clock pulses.

16. The solid state timepiece of claim 15 in which said reset means includes strobed latch means for producing output signals determined by the state of the reset signals only at the time of a clock pulse.

* * * * *